United States Patent
Yoshikawa et al.

(10) Patent No.: US 7,262,514 B2
(45) Date of Patent: Aug. 28, 2007

(54) EPOXY RESIN COMPOSITION FOR SEMICONDUCTOR ENCAPSULATION, SEMICONDUCTOR DEVICE USING THE SAME, AND PROCESS FOR PRODUCING SEMICONDUCTOR DEVICE

(75) Inventors: Keisuke Yoshikawa, Ibaraki (JP); Kazuhito Hosokawa, Ibaraki (JP); Takuji Okeyui, Ibaraki (JP); Kazuhiro Ikemura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 286 days.

(21) Appl. No.: 11/115,307

(22) Filed: Apr. 27, 2005

(65) Prior Publication Data

US 2005/0253286 A1 Nov. 17, 2005

(30) Foreign Application Priority Data

Apr. 30, 2004 (JP) ............ P. 2004-136137
Aug. 5, 2004 (JP) ............ P. 2004-229715

(51) Int. Cl.
*H01L 23/29* (2006.01)
(52) U.S. Cl. ............ 257/793; 257/788; 257/787; 438/127; 428/1.53; 156/330
(58) Field of Classification Search ........ 257/787–789, 257/793, 795, E23.119; 438/126–127, 108, 438/124; 156/330; 428/1.53, 413, 355 EP
See application file for complete search history.

(56) References Cited

U.S. PATENT DOCUMENTS 5,940,688 A * 8/1999 Higuchi et al. ............ 438/127
5,985,455 A * 11/1999 Tokunaga et al. .......... 428/413
5,998,509 A 12/1999 Hayase et al.
6,143,423 A * 11/2000 Shiobara et al. ............ 428/620
6,231,997 B1 * 5/2001 Arai et al. ................. 428/620
6,962,744 B2 * 11/2005 Amagai et al. .......... 428/297.4
2003/0159773 A1 * 8/2003 Tomiyama et al. ......... 156/248
2003/0194562 A1 * 10/2003 Ishii et al. ................. 428/413

FOREIGN PATENT DOCUMENTS

JP 9-252014 A 9/1997

OTHER PUBLICATIONS

Patent Abstrascts of Japan—(JP-A-9 252014) Kimura Toshihiro, "Manufacturing Method of Semiconductor Element" (1998) vol. 1998, No. 01.
European Search Report dated Aug. 12, 2005.

* cited by examiner

*Primary Examiner*—Mary Wilczewski
*Assistant Examiner*—Thanh Y. Tran
(74) *Attorney, Agent, or Firm*—Sughrue Mion, PLLC

(57) ABSTRACT

An epoxy resin composition for semiconductor encapsulation in producing surface mount lead-less thin semiconductor devices. The epoxy resin composition for surface mount lead-less semiconductor device encapsulation which device comprising an encapsulating resin layer and, encapsulated therein, a substrate, a semiconductor element mounted on the substrate, two or more conductive parts disposed around the semiconductor element, and wires which electrically connect electrodes of the semiconductor element to the conductive parts, wherein the bottom face of the substrate and the bottom face of each conductive part are exposed without being encapsulated in the encapsulating resin layer, and the epoxy resin composition used for forming the encapsulating resin layer has the following properties (α) and (β): (α) a melt viscosity of 2-10 Pa.s at 175° C.; and (β) a flexural strength of cured state of 130 MPa or higher at ordinary temperature.

8 Claims, 3 Drawing Sheets

US 7,262,514 B2

EPOXY RESIN COMPOSITION FOR SEMICONDUCTOR ENCAPSULATION, SEMICONDUCTOR DEVICE USING THE SAME, AND PROCESS FOR PRODUCING SEMICONDUCTOR DEVICE

FIELD OF THE INVENTION

The present invention relates to an epoxy resin composition for semiconductor encapsulation which is used as an encapsulating material for producing surface mount-type semiconductor devices of a lead-less structure, in particular, thin and low-cost semiconductor devices. The invention further relates to a surface mount-type lead-less semiconductor device obtained with the epoxy resin composition and a process for producing the semiconductor device.

BACKGROUND OF THE INVENTION

In the package mounting of semiconductor integrated circuits, individual parts such as transistors and diodes, and especially recently, LSIs, there are desires for package size reduction, thickness reduction, and integration degree increase. LSI mounting techniques include the packages of the type having lead terminals incorporated in the package, and this type of packages, which is represented by QFNs (quad flat non-leaded packages), is one of the package types which are especially attracting attention from the standpoints of size reduction and integration degree increase. A process which is especially attracting attention in recent years among processes for QFN production comprises orderly arranging chips for OFNs on a die pad in a package pattern region of a lead frame, en bloc encapsulating the chips in the cavity of a mold with an encapsulating resin material, and then cutting the molding into individual QFN structures to thereby greatly improve the productivity per unit lead frame area. On the other hand, for attaining improved connection reliability in the mounting of semiconductor devices on substrates such as mother boards, there is a desire for a semiconductor device having the so-called standoff, i.e., a semiconductor device in which the conductor on the mounting side partly projects from the encapsulating resin.

Furthermore, semiconductor devices of a lead-less structure have been developed recently for the purpose of thickness reduction. The following process has, for example, been proposed as a process for producing such a lead-less semiconductor device. First, a metal foil is laminated to a base and etched so that the metal foil remains in given areas to form a die pad part 23a and conductive parts 23b on the base 20 as shown in FIG. 7. Subsequently, a semiconductor element 21 is bonded to the die pad part 23a through an adhesive layer 24, and the semiconductor element 21 is then electrically connected to the conductive parts 23b with wires 25. The resultant structure is subjected to transfer molding with a mold to thereby resin-encapsulate the structure so that only the space in which the semiconductor element 21 is electrically connected to the conductive parts 23b is filled with an encapsulating resin layer 26. Thereafter, the base 20 is separated from the encapsulating resin layer 26 to thereby produce a package including the encapsulated semiconductor element as shown in FIG. 8 (see document 1). In this process, since a die pad part 23a and conductive parts 23b are formed on a base 20, the conductive parts can have a reduced thickness. In addition, when such packages thus obtained through resin encapsulation with an encapsulating material are separated into individual packages, there is no need of cutting a lead frame. This process hence has an advantage that blade wear by dicing is slight.

Document 1: JP-A-9-252014

SUMMARY OF THE INVENTION

However, the process in which a lead frame is used to conduct en bloc encapsulation has the following disadvantages. Although productivity improvement, package size reduction, and integration degree increase can be realized by the process, multiple-row wiring arrangement made up of, e.g., 3 or more rows is difficult and the increase in the number of pins is limited. With respect to the standoff structure also, the silicone pressure-sensitive adhesive which is mainly used in the heat-resistant pressure-sensitive adhesive tape to be applied to the lower side of a lead frame in QFN molding has been highly crosslinked so as to have enhanced heat resistance and hence has poor fluidity. Although the production of a semiconductor device having a standoff structure necessitates a step in which part of the conductor is embedded in the pressure-sensitive adhesive layer, this embedding is difficult for the reason shown above. As a result, it has been difficult to produce a semiconductor device having the standoff structure. In addition, the lead frame is generally required to have a thickness of 100 to 200 µm from the standpoints of transferability and handleability in semiconductor device production steps, and this has been an obstacle to thickness reduction in semiconductor devices.

In the semiconductor device production process proposed in patent document 1, the base 20 is required to be sufficiently adherent to the metal foil parts in the metal foil etching step for forming a die pad part 23a and conductive parts 23b and in the transfer molding step for resin encapsulation. On the other hand, after the transfer molding, the base 20 is required to be easily separated from the encapsulating resin layer 26 and also from the metal foil parts. The base 20 and the metal foil are thus required to have conflicting properties regarding adhesiveness. Namely, the base 20 is required to have both resistance to the chemical to be used for the etching and durability which prevents the semiconductor element 21 from shifting at the high temperature during transfer molding and under the pressure applied thereto when the molding resin flows in the mold. Despite this, the base 20 is required, after the resin molding, to be capable of being easily separated from the encapsulating resin layer 26 and from the metal foil. However, none of the materials shown in document 1 as examples of the base 20, i.e., Teflon (trademark) materials, silicone materials, and metallic or other materials coated with Teflon (trademark), can satisfy such conflicting adhesive properties at all. The proposed encapsulating material and process for semiconductor device production have been unsatisfactory.

In addition, although the base 20 after resin molding should be capable of being easily separated from the encapsulating resin layer 26, no proposal for satisfying this requirement is made in document 1. The proposed process hence has a problem that it is difficult to stably produce highly reliable semiconductor devices.

The present invention has been achieved under these circumstances. An object of the present invention is to provide an epoxy resin composition for semiconductor encapsulation which is used as an encapsulating material for producing surface mount-type thin semiconductor devices of a lead-less structure. Another object of the present invention is to provide a surface mount-type semiconductor device of a lead-less structure obtained with the composition. A still other object of the present invention is to provide a process for producing the semiconductor device.

In order to accomplish those objects, the invention provides, according to a first aspect thereof, an epoxy resin composition for semiconductor encapsulation which is for use in producing a semiconductor device comprising an encapsulating resin layer and, encapsulated therein, a substrate, a semiconductor element mounted on the substrate, two or more conductive parts disposed around the semiconductor element, and electrically connecting parts which electrically connect electrodes of the semiconductor element to the conductive parts, wherein the bottom face of the substrate and the bottom face of each conductive part are exposed without being encapsulated in the encapsulating resin layer, and the epoxy resin composition used for forming the encapsulating resin layer has the following properties (α) and (β):

(α) the epoxy resin composition has a melt viscosity as measured at 175° C. of from 2 to 10 Pa.s; and (β) the epoxy resin composition gives a cured resin having a flexural strength as measured at ordinary temperature of 130 MPa or higher.

The present invention further provides, according to a second aspect thereof, a semiconductor device which comprises an encapsulating resin layer and, encapsulated therein, a substrate, a semiconductor element mounted on the substrate, two or more conductive parts disposed around the semiconductor element, and electrically connecting parts which electrically connect electrodes of the semiconductor element to the conductive parts, wherein the bottom face of the substrate and the bottom face of each conductive part are exposed without being encapsulated in the encapsulating resin layer, and the encapsulating resin layer comprises a cured resin formed from the epoxy resin composition for semiconductor encapsulation described above.

The invention furthermore provides, according to a third aspect thereof, a process for producing the semiconductor device described above which comprises: preparing an adhesive sheet comprising a base and an adhesive layer formed on a surface thereof; forming a substrate for semiconductor element mounting and two or more conductive parts in given areas of the adhesive layer side of the adhesive sheet; bonding the face of a semiconductor element which has no electrodes to the substrate to thereby mount the semiconductor element on the substrate; electrically connecting electrodes of the semiconductor element mounted on the substrate to the conductive parts; resin-encapsulating the substrate, the semiconductor element mounted on the substrate, the conductive parts formed on the adhesive sheet, and the electrically connecting parts for the conductive parts with an epoxy resin composition having the following properties (α) and (β) to thereby form a semiconductor device on the adhesive sheet; and stripping off the adhesive sheet from the semiconductor device formed:

(α) the epoxy resin composition has a melt viscosity as measured at 175° C. of from 2 to 10 Pa.s; and (β) the epoxy resin composition gives a cured resin having a flexural strength as measured at ordinary temperature of 130 MPa or higher.

BRIEF DESCRIPTION OF THE DRAWINGS

By way of example and to make the description more clear, reference is made to the accompanying drawing in which.

DESCRIPTION OF REFERENCE NUMERALS

Figure 1:
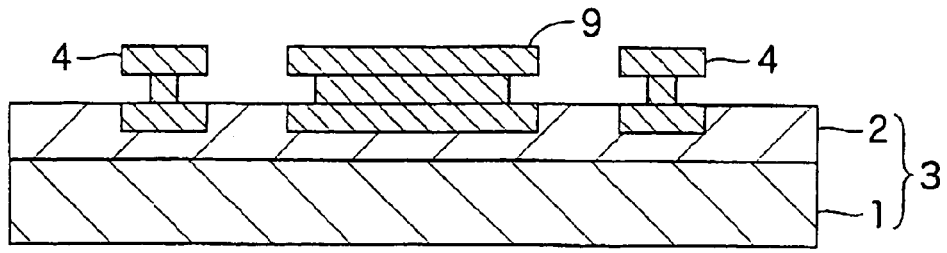
FIG. 1 is a sectional view showing a semiconductor device production step in the invention.

1: base
2: adhesive layer
3: adhesive sheet
4: conductive part
5: semiconductor element
6: electrode
7: wire
8: encapsulating resin layer
9: substrate The present inventors made extensive investigations in order to develop an encapsulating material for obtaining a highly reliable thin semiconductor device of a lead-less structure and to develop a process for semiconductor device production with such encapsulating material. As a result, the following novel process and special encapsulating material used for the process were found out. Namely, an adhesive sheet comprising a base and an adhesive layer formed on a surface thereof is prepared, and a substrate for semiconductor element mounting and two or more conductive parts are formed on this adhesive layer. The face of a semiconductor element which has no electrodes is bonded to the substrate to thereby mount the semiconductor element. Subsequently, electrodes of the semiconductor element mounted on the substrate are electrically connected to the conductive parts. Thereafter, the semiconductor element, conductive parts, and parts electrically connecting these are resin-encapsulated with an epoxy resin composition to form a semiconductor device on the adhesive sheet. Subsequently, the adhesive sheet is stripped off from the semiconductor device formed. In this process for producing a semiconductor device of a lead-less structure, when the epoxy resin composition used as an encapsulating material is has a melt viscosity as measured at 175° C. of from 2 to 10 Pa.s and gives a cured resin having a flexural strength as measured at ordinary temperature of 130 MPa or higher, then the semiconductor device can be easily separated from the adhesive sheet and a highly reliable thin semiconductor device of a lead-less structure is obtained. Based on these new findings, the invention has been thus achieved.

As shown above, the epoxy resin composition for semiconductor encapsulation of the present invention is used in producing a semiconductor device comprising an encapsulating resin layer and, encapsulated therein, a substrate, a semiconductor element mounted on the substrate, two or more conductive parts disposed around the semiconductor element, and electrically connecting parts which electrically connect electrodes of the semiconductor element to the conductive parts, wherein the bottom face of the substrate and the bottom face of each conductive part are exposed without being encapsulated in the encapsulating resin layer, and the epoxy resin composition used for forming the encapsulating resin layer has the properties (α) and (β) shown above. Because of this, the semiconductor device can be easily separated from the adhesive sheet, which will be described later, in a step in semiconductor device production. As a result of the stripping of the adhesive sheet from the produced semiconductor device in the step in semiconductor device production, the semiconductor element mounted on the substrate and the conductive parts are wholly transferred satisfactorily to the encapsulating resin layer formed from the epoxy resin composition; the semiconductor element and the conductive parts are embedded in the encapsulating resin layer. The semiconductor device thus obtained has a structure in which the bottom face of the substrate having the semiconductor element mounted thereon and the bottom face of each conductive part are exposed without being encapsulated in the encapsulating resin layer. Namely, a lead-less structure having a reduced thickness is obtained.

In the process of the invention for producing a semiconductor device, a substrate for mounting semiconductor element thereon and two or more conductive parts are formed on the adhesive layer side of an adhesive sheet comprising a base and an adhesive layer formed thereon. The face of a semiconductor element which has no electrodes is bonded to the substrate to thereby mount the semiconductor element. Subsequently, electrodes of the semiconductor element mounted on the substrate are electrically connected to the conductive parts. Thereafter, the substrate, semiconductor element, conductive parts, and parts electrically connecting these are resin-encapsulated with an epoxy resin composition having the properties (α) and (β) to thereby form a semiconductor device on the adhesive sheet. Subsequently, the adhesive sheet is stripped off from the semiconductor device formed. Because of this procedure, the semiconductor device obtained has a structure in which the bottom face of the substrate having the semiconductor element mounted thereon and the bottom face of each conductive part are exposed without being encapsulated in the encapsulated resin layer, as stated above. Thus, a lead-less structure having a reduced thickness is obtained. Furthermore, since the substrate having a semiconductor element mounted thereon and the conductive parts have been bonded to the adhesive layer of the adhesive sheet, the semiconductor element does not suffer positional shifting or the like and a semiconductor device can be produced through a small number of steps. A cost reduction is hence realized. In addition, since an epoxy resin composition having the properties (α) and (β) is used in the process for semiconductor device production, the semiconductor device can be easily separated from the adhesive sheet. As a result of the stripping of the adhesive sheet from the semiconductor device, the substrate having a semiconductor element mounted thereon and the conductive parts are wholly transferred satisfactorily to the encapsulating resin layer formed from the epoxy resin composition; the substrate and the conductive parts are embedded in the encapsulating resin layer.

It is preferred that the conductive parts each have an overhang on each of the upper and lower sides thereof. This is because such overhangs produce an anchoring effect in the encapsulating resin layer to thereby further heighten the conductive part/encapsulating resin layer jointing strength.

When the adhesive layer of the adhesive sheet is formed from a thermosetting adhesive composition, the conductive parts are easily formed.

When the adhesive layer of the adhesive sheet is one formed from an epoxy resin composition having the specific properties x and y (x: the epoxy resin composition after cure has a glass transition temperature of 150° C. or higher and y: the epoxy resin composition after cure has a modulus as measured at 200° C. of 1 MPa or higher), the adhesive sheet can be easily stripped off from the semiconductor device formed on the adhesive sheet. As a result, the substrate and the conductive parts are satisfactorily transferred in the state of being embedded in the encapsulating resin layer.

Figure 5:
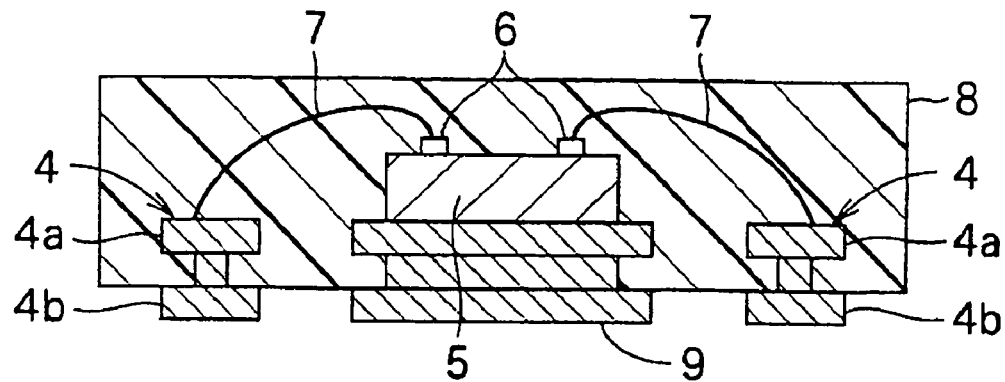
FIG. 5 is a sectional view illustrating one example of semiconductor devices obtained by the semiconductor device production process of the invention.

The semiconductor device of the present invention, which is a semiconductor device of a lead-less structure, is explained below by reference to an example thereof. As shown in FIG. 5, this semiconductor device has a structure in which electrodes 6 disposed on the upper face of a semiconductor element 5 mounted on a substrate 9 have been electrically connected with wires 7 to upper parts of conductive parts 4 disposed in given areas around the semiconductor element 5. The substrate 9, the semiconductor element 5, the conductive parts 4, and the wires 7 electrically connecting the electrodes 6 to the conductive parts 4 have been resin-encapsulated with an encapsulating resin layer 8 for protection against the surrounding environment. Namely, the spatial part in which the semiconductor element 5 is electrically connected to the conductive parts 4 is filled with the encapsulating resin layer 8. On the bottom side of the semiconductor device, the bottom face of the substrate 9, i.e., the backside opposite to the face for mounting semiconductor element 5, and the bottom face of each conductive part 4 are exposed so that the substrate 9 and the conductive part 4 partly protrude from the encapsulating resin layer 8.

Figure 6A:
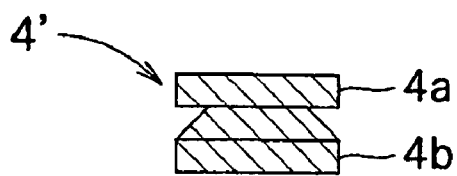
FIG. 6A and FIG. 6B are sectional views showing other shapes of conductive parts.
Figure 6B:
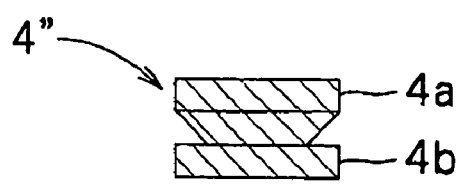
Figure 7:
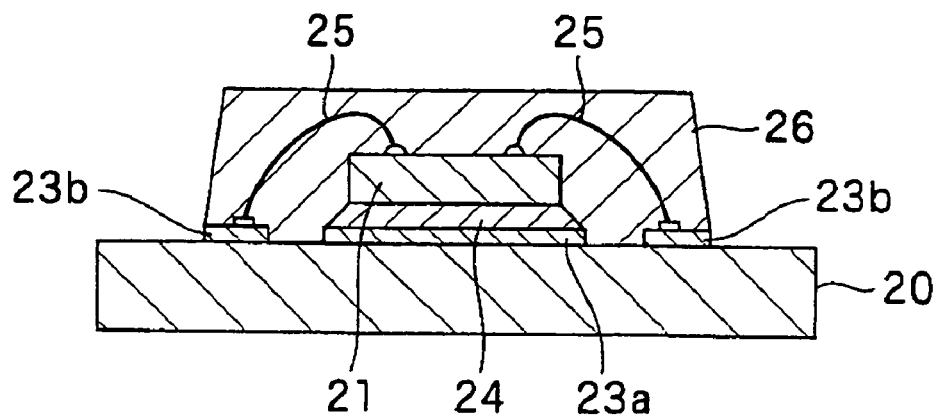
FIG. 7 is a sectional view showing a semiconductor device production step heretofore in use.
Figure 8:
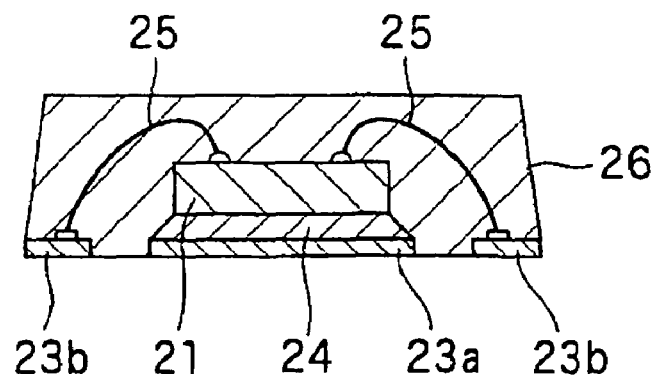
FIG. 8 is a sectional view showing another semiconductor device production step heretofore in use.

With respect to the shape of the conductive parts 4, it is preferred that each conductive part 4 have overhangs (ribs) 4a and 4b respectively on the upper and lower sides thereof as shown in FIG. 5. This is because such overhangs produce an anchoring effect in the encapsulating resin layer 8 to thereby further heighten the strength of the jointing of the conductive parts 4 to the encapsulating resin layer 8. Besides the shape comprising a cylindrical part having overhangs 4a and 4b formed respectively on the upper and lower sides thereof as shown in FIG. 5, examples of the shape of the conductive parts 4 include: a conductive part 4' which comprises upper and lower overhangs 4a and 4b separated by a part which is tapered so that its sectional area gradually decreases toward the upper overhang, i.e., so as to have the shape of a frustum of cone, as shown in FIG. 6(a); and a conductive part 4" which comprises upper and lower overhangs 4a and 4b separated by a part which is tapered so that its sectional area gradually increases toward the upper overhang, i.e., so as to have the shape of an inverted frustum of cone, as shown in FIG. 6(b). The shape of the conductive parts 4 is suitably determined according to the intended use and kind thereof, etc. However, the shape shown in FIG. 6(b) is apt to produce an anchoring effect because the lower parts of the conductive parts 4" are tightly held.

The conductive parts 4 are independent terminals disposed in a matrix arrangement. The independent terminals are comprises a material such as, e.g., copper or a copper alloy, and have been disposed in a CSP (chip scale/size package) terminal pattern arrangement. The electrical contact point parts of some independent terminals are coated (plated) with a material such as silver, nickel, palladium, or gold. The thickness of such independent terminals (conductive parts 4) is generally preferably about 5 to 100 μm.

The independent terminals are preferably arranged in order according to the pattern of individual CSPs so that the resin-encapsulated structure can be easily cut into packages in a later cutting step.

One example of processes for producing the semiconductor device of the invention will be explained below.

First, an adhesive sheet 3 is prepared which comprises a base 1 and an adhesive layer 2 formed on a surface thereof as shown in FIG. 1. Thereafter, a substrate 9 for mounting semiconductor element thereon and two or more conductive parts 4 are formed in given areas of the adhesive layer 2 side of the adhesive sheet 3 so that the substrate 9 and the conductive parts 4 are partly embedded in the adhesive layer 2. In the case where the adhesive layer 2 is made of a thermosetting adhesive composition, the substrate 9 and conductive parts 4 formed to be partly embedded in the adhesive layer 2 are fixed to the adhesive sheet 3 through heat curing in a later step. Use of such adhesive layer is preferred because positional shifting or the like does not occur in the production steps.

For forming a substrate 9 and conductive parts 4 in given areas of the adhesive layer 2 side of the adhesive sheet 3 so that the substrate 9 and the conductive parts 4 are in the state of being partly embedded in the adhesive layer 2, the following method may, for example, be used. A metal foil is laminated to the adhesive sheet 3 under heating, whereby the metal foil can be partly embedded. Subsequently, the metal foil is etched by the photolithographic pattern etching technique in general use to thereby remove those parts of the metal foil which do not correspond to the conductive parts. Thus, conductive parts 4 can be formed. When the substrate 9 and the conductive parts 4 are partly embedded in the adhesive layer 2, the thickness of the embedded parts is preferably regulated to 5-30% of the overall thickness of each of the substrate 9 and conductive parts 4 from the standpoint of heightening the mounting reliability of the semiconductor device having a standoff structure.

Figure 2:
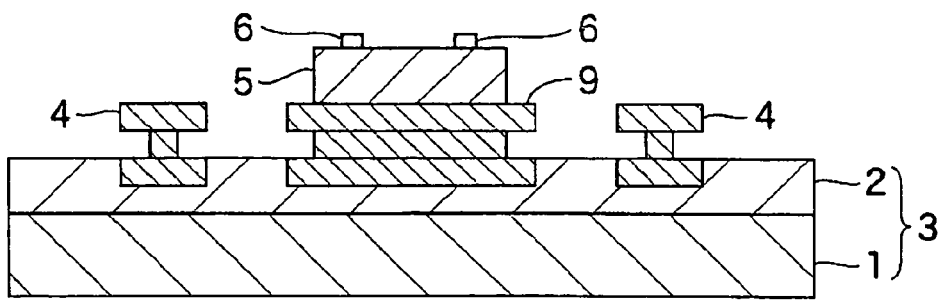
FIG. 2 is a sectional view showing another semiconductor device production step in the invention.
Figure 3:
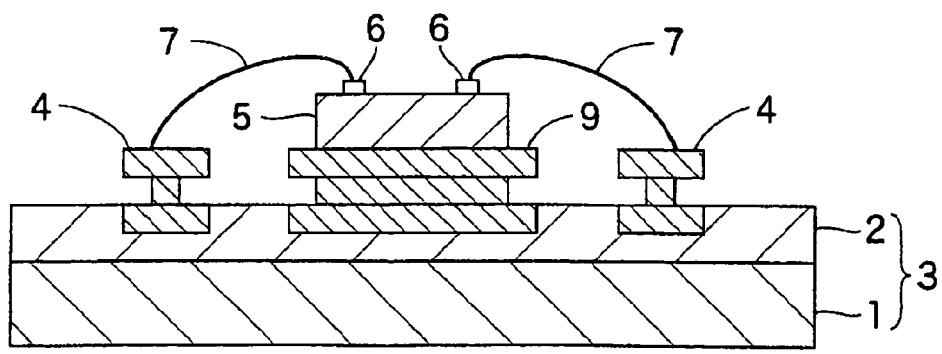
FIG. 3 is a sectional view showing still another semiconductor device production step in the invention.

Subsequently, as shown in FIG. 2, that face of a semiconductor element 5 which does not have electrodes 5 is bonded to the substrate 9 by utilizing, e.g., a known adhesive to thereby mount the semiconductor element 5 on the substrate 9. Thereafter, the electrodes 6 of the semiconductor element 5 mounted on the substrate 9 are electrically connected to the conductive parts 4 using wires 7 as shown in FIG. 3 (wire bonding).

Figure 4:
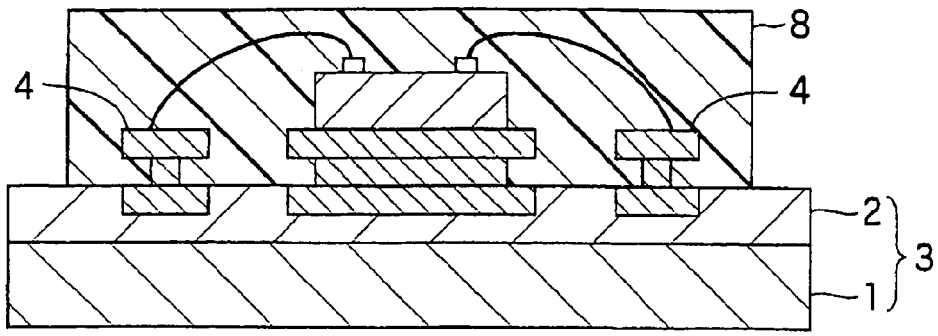
FIG. 4 is a sectional view showing a further semiconductor device production step in the invention.

After the wire bonding, the substrate 9, the semiconductor element 5 mounted on the substrate 9, the conductive parts 4 formed on the adhesive sheet 3, and the wires 7 are resin-encapsulated with an epoxy resin composition having the specific properties to thereby form an encapsulating resin layer 8 as shown in FIG. 4. Thus, a semiconductor device is formed on the adhesive sheet 3. After the formation of the semiconductor device on the adhesive sheet 3, the adhesive sheet 3 is stripped from this semiconductor device to thereby obtain a semiconductor device having the structure shown in FIG. 5.

The resin encapsulation with an epoxy resin composition is conducted with a mold, for example, by utilizing the ordinary transfer molding method. After the molding, the encapsulating resin layer 8 is subjected to postcure heating according to need. This postcure heating may be conducted before stripping the adhesive sheet 3 from the semiconductor device or after the stripping. It is, however, preferred to conduct the heating before the stripping of the adhesive sheet 3 because stripping is easy.

The adhesive sheet 3 to be used in semiconductor device production is preferably those which is capable of securely fix the substrate 9 for mounting a semiconductor element 5 thereon and the conductive parts 4 until completion of the resin encapsulation step and which can be easily stripped off when desired to be stripped from the semiconductor device. The adhesive sheet 3 having such properties has a constitution comprising a base 1 and an adhesive layer 2 formed on a surface thereof as shown above. The thickness of the base 1 is not particularly limited, but is regulated so as to be in the range of generally about 10 to 200 μm, preferably 25 to 100 μm, especially preferably 50 to 100 μm, from the standpoint of handleability. The thickness of the adhesive layer 2 is not particularly limited, but is regulated so as to be in the range of generally from about 1 to 50 μm, preferably from 5 to 30 μm, from the standpoint of film formation.

Examples of the base 1 include bases made of plastics such as polyesters, polyamides, poly(phenylene sulfide), polyetherimides, polyimides, and poly(ethylene naphthalate), porous bases made of such plastics, paper bases such as glassine paper, high quality paper, and Japanese paper, nonwoven fabrics made of cellulose, polyamides, polyesters, aramids, or the like, and metallic film bases such as copper foils, aluminum foils, SUS foils, and nickel foils. From the standpoint of easy handling, it is preferred to use a metallic film base among these bases.

Examples of adhesive compositions usable for forming the adhesive layer 2 of the adhesive sheet 3 include various pressure-sensitive adhesives such as silicone and acrylic ones and various adhesives including epoxy resin/rubber adhesives and polyimide adhesives. Thermosetting adhesive compositions are preferred of these from the standpoints of heat resistance and adhesiveness. In particular, it is preferred to use an epoxy resin composition comprising an epoxy resin and an elastic material (e.g., a rubber ingredient) incorporated therein. A preferred example of such epoxy resin compositions is an epoxy resin composition comprising an epoxy resin (ingredient a), a hardener (ingredient b) for the epoxy resin, and an elastic material (ingredient c) as essential components. In the case where this epoxy resin composition is used, it is generally possible to laminate a material for forming the substrate and conductive parts to the adhesive layer which is in the so-called B-stage state (semi-cured state). The laminating can be conducted at a relating low temperature, i.e., below 150° C. In addition, by thermally hardening the adhesive layer after the laminating, the modulus and heat resistance thereof can be improved.

Examples of the epoxy resin (ingredient a) include glycidylamine type epoxy resins, bisphenol F epoxy resins, bisphenol A epoxy resins, phenol-novolac epoxy resins, cresol-novolac epoxy resins, biphenyl type epoxy resins, naphthalene type epoxy resins, aliphatic epoxy resins, alicyclic epoxy resins, heterocyclic epoxy resins, spiro ring-containing epoxy resins, and halogenated epoxy resins. These may be used alone or in combination of two or more thereof.

The epoxy resin (ingredient a) to be used is preferably those having an epoxy equivalent of 1,000 g/eq or lower, more preferably one having an epoxy equivalent of 650 g/eq or lower, from the standpoint of preventing adhesive remaining after adhesive sheet stripping.

The content of the epoxy resin (ingredient a) is regulated to preferably from 40 to 95% by weight, more preferably from 60 to 80% by weight, based on the whole epoxy resin composition from the standpoints of heat resistance and flexibility.

Examples of the hardener (ingredient b) for the epoxy resin include phenolic resins, various imidazole compounds and derivatives thereof, hydrazine compounds, dicyandiamide, and microcapsules of any of these compounds. These hardeners may be used alone or in combination of two or more thereof. In the case where a phenolic resin is used as the hardener, it may be used in combination with a hardening accelerator such as, e.g., a phosphorus compound such as triphenylphosphine.

The content of the hardener (ingredient b) cannot be unconditionally specified because it varies depending on the kind thereof. However, in the case of a phenolic resin, for example, it is preferred that this hardener be contained in an amount of one equivalent to the epoxy resin. The content of another hardener and that of the hardening accelerator each are preferably 0.05-5 parts by weight (hereinafter abbreviated as "parts"), more preferably 0.1-3 parts, per 100 parts of the epoxy resin.

Examples of the elastic material (ingredient c) include rubber ingredients heretofore in use in epoxy resin adhesives, such as acrylonitrile/butadiene rubbers (NBRs) and acrylic rubbers, and further include acrylic resins, phenoxy resins, and polyamide resins. These may be used alone or in combination of two or more thereof. It is preferred to use an NBR among these elastic materials from the standpoint of ease of adhesive sheet stripping after the formation of an encapsulating resin layer. Especially preferred is an NBR in which the content of acrylonitrile. comonomer units is preferably 5% by weight or higher, more preferably 5-30% by weight, especially preferably 5-20% by weight. It is more preferred to use a rubber modified with carboxyl groups. Specific examples of such rubbers include acrylonitrile/butadiene rubbers such as Nipol 1072J, manufactured by Nippon Zeon Co., Ltd., and acrylic rubbers such as Paracron ME2000, manufactured by Negami Chemical Industrial Co., Ltd.

The content of the elastic material (ingredient c) is regulated to preferably 5-40% by weight, more preferably 5-30% by weight, based on the whole epoxy resin composition from the standpoints of flexibility and heat resistance.

Various known additives can be added besides the epoxy resin (ingredient a), epoxy resin hardener (ingredient b), and elastic material (ingredient c) as long as the addition thereof does not deteriorate the properties of the adhesive sheet. Examples of the additives include fillers for imparting conductivity, inorganic fillers, organic fillers, antioxidants, pigments, silane coupling agents, and tackifiers. It is preferred to use an antioxidant among these additives because it is an additive effective in preventing high-temperature deterioration.

An antistatic function can be imparted to the adhesive sheet 3 according to need. Examples of methods for imparting an antistatic function to the adhesive sheet 3 include a method in which an antistatic agent or a conductive filler is incorporated into the materials for forming the adhesive layer 2 and those for forming the base 1; and a method in which an antistatic agent is applied to the interface between the base 1 and the adhesive layer 2 and to the back side of the base 1 to form an antistatic layer. By thus imparting an antistatic function to the adhesive sheet 3, static buildup can be inhibited from occurring when the adhesive sheet 3 is separated from the semiconductor device. The antistatic agent is not particularly limited as long as it has an antistatic function. Examples thereof include various surfactants such as acrylic amphoteric surfactants, acrylic cationic surfactants, and maleic anhydride/styrene anionic surfactants. Specific examples of materials usable for forming an antistatic layer include BONDEIP PA, BONDEIP PX, and BONDEIP P, all manufactured by Konishi Co., Ltd. As the conductive filler can be used a known one. Examples thereof include metals such as Ni, Fe, Cr, Co, Al, Sb, Mo, Cu, Ag, Pt, and Au, alloys or oxides of these metals, and carbons such as carbon black. These may be used alone or in combination of two or more thereof. The conductive filler may be either powdery or fibrous.

Examples of methods for producing the adhesive sheet 3 include: a method in which materials for forming an adhesive layer 2 are dissolved in an organic solvent and this solution is applied to a base 1 and dried with heating; and a method in which materials for forming an adhesive layer 2 are dispersed in an aqueous medium and this dispersion is applied to a base 1 and dried with heating. More specifically, the adhesive sheet 3 is produced, for example, in the following manner. The ingredients described above which are materials for forming an adhesive layer 2 are mixed together and dissolved in an organic solvent to prepare an adhesive solution. Subsequently, this adhesive solution is applied to a surface of a base 1 and then dried to remove the organic solvent. Thus, an adhesive sheet is produced which comprises the base 1 and an adhesive layer 2 formed on the surface thereof. It is preferred to use a ketone solvent, e.g., methyl ethyl ketone, as the organic solvent from the standpoint of solubility. Examples of methods for producing an adhesive sheet 3 in which the adhesive layer is composed of two or more layers include: a method in which adhesive layers are successively formed on a base 1; a method in which one or more adhesive layers separately produced beforehand with a release liner or the like is laminated to another adhesive layer or a base 1; and a method in which a suitable combination of these methods is used to produce the target adhesive sheet.

In order that the substrate 9 and the conductive parts 4 be partly embedded in the adhesive layer 2 of the adhesive sheet 3 in producing a semiconductor device, the adhesive layer 2 preferably has a low viscosity at the temperature at which the conductor serving as a material for forming the substrate 9 and conductive parts 4 is laminated to the adhesive sheet 3. After heat cure, the adhesive layer 2 preferably has a high viscosity in order that the partly embedded substrate 9 and conductive parts 4 be stably fixed. Furthermore, there are cases where the adhesive sheet 3 undergoes a heat history involving a temperature close to 200° C. in the wire bonding step or resin encapsulation step in semiconductor device production. It is therefore preferred that the adhesive sheet 3 should have excellent heat resistance so as to enable stable production steps even in such an environment. Likewise, the base 1 of the adhesive sheet 3 also is required to retain rigidity in the wire bonding step. From these standpoints, the adhesive sheet 3 preferably has the following properties. The modulus of the adhesive layer 2 before cure, as measured at 120° C., is in the range of preferably $1\times10^2$-$1\times10^4$ Pa, more preferably $1\times10^2$-$1\times10^3$ Pa. The modulus of the adhesive layer 2 after cure, as measured at 200° C., is preferably 1 MPa or higher, more preferably 1.5-100 MPa. The glass transition temperature of the adhesive layer 2 after cure is preferably 150° C. or higher, more preferably 170° C. or higher. The reasons for these are as follows. Adhesives giving an adhesive layer 2 which before cure has a modulus exceeding $1\times10^4$ Pa at 120° C. are undesirable because production may be difficult due to the structure thereof. In case where the adhesive layer 2 after cure has a glass transition temperature lower than 150° C., there may be a tendency to arouse a trouble, for example, that the conductive parts 4 become shaky in, e.g., the wire bonding step (usually 150° C. or higher) which will be described later, resulting in a reduced percentage of non-defectives. Furthermore, this adhesive layer 2 flows in the encapsulating-resin molding step (generally conducted at 175° C.), which will be described later, and this tends to be causative of a greater peel force in a later stripping step. In the case where the adhesive layer 2 after cure has a modulus lower than 1 MPa at 200° C., there is a tendency to arouse a trouble, for example, that the conductive parts 4 become shaky in, e.g., the wire bonding step (usually 150° C. or higher) which will be described later, resulting in a reduced percentage of non-defectives, as in the case shown above.

The base 1 of the adhesive sheet 3 preferably has a modulus as measured at 200° C. of 1.0 GPa or higher. The upper limit of the modulus of the base 1 as measured at 200° C. is generally 1,000 GPa. This is because in case where the modulus of the base 1 as measured at 200° C. is lower than 1.0 GPa, the adhesive sheet 3 may tend to be unable to exhibit sufficient resistance to the force applied thereto by bonding in the wire bonding step.

When the adhesive layer 2 and the base 1 have such values of modulus, the adhesive layer 2 is less apt to soften/flow in, e.g., the wire bonding step shown in FIG. 3 and wire bonding can be conducted more stably. Examples of methods for measuring those moduli include the measuring method described in the Examples which will be given later.

The epoxy resin composition for semiconductor encapsulation of the present invention, which is the material for forming the encapsulating resin layer 8, is obtained, for example, from an epoxy resin (ingredient A), a phenolic resin (ingredient B), a hardening accelerator (ingredient C), and an inorganic filler (ingredient D). It is generally in the form of a powder or tablets obtained by tableting it.

Examples of the epoxy resin (ingredient A) include biphenyl type epoxy resins and polyfunctional epoxy resins. These may be used alone or in combination of two or more thereof.

The phenolic resin (ingredient B) functions as a hardener for the epoxy resin (ingredient A), and examples thereof include phenolic novolacs, naphthol novolacs, and biphenyl novolacs. These may be used alone or in combination of two or more thereof.

The epoxy resin (ingredient A) and the phenolic resin (ingredient B) are mixed together preferably in such a proportion that the amount of the hydroxyl groups in the phenolic resin (ingredient B) is from 0.5 to 2.0 equivalents, more preferably from 0.8 to 1.2 equivalents, to the epoxy groups in the epoxy resin (ingredient A).

Examples of the hardening accelerator (ingredient C) to be used together with ingredients A and B include amine compounds and phosphorus compounds. Examples of the amine hardening accelerators include imidazole compounds such as 2-methylimidazole and tertiary amines such as triethanolamine and 1,8-diazabicyclo[5.4.0]undecane-7. Examples of the phosphorus compounds include triphenylphosphine and tetraphenylphosphonium tetraphenylborate. These may be used alone or in combination of two or more thereof. The hardening accelerator (ingredient C) is incorporated in an amount of preferably from 0.1 to 2.0% by weight based on the whole epoxy resin composition. When the flowability of the epoxy resin composition is taken into account, the proportion of hardening accelerator is especially preferably from 0.15 to 0.35% by weight.

The inorganic filler (ingredient D) to be used together with ingredients A to C is not particularly limited, and various known inorganic fillers may be used. Examples thereof include a quartz glass powder, silica powder, alumina, and talc. Especially preferred examples thereof include a spherical fused silica powder and a pulverized silica powder. These may be used alone or in combination of two or more thereof. The amount of the inorganic filler (ingredient D) to be incorporated is preferably from 80 to 90% by weight, more preferably from 85 to 90% by weight, based on the whole epoxy resin composition.

Other additives can be suitably incorporated into the epoxy resin composition for semiconductor encapsulation according to need. Examples thereof include pigments or colorants such as carbon black, release agents such as oxidized polyethylene wax, silane coupling agents, flame stress-relieving agents, and tackifiers.

The epoxy resin composition for semiconductor encapsulation can be produced, for example, in the following manner. Namely, the composition can be produced through a series of steps comprising mixing ingredients A to D described above optionally together with other additives, treating the mixture with a kneading machine, e.g., heated rolls or a kneader, to melt and mix the ingredients with heating, cooling the melt to room temperature, subsequently pulverizing it by utilizing a known technique, and tableting the powder according to need.

The epoxy resin composition for semiconductor encapsulation thus obtained should have a melt viscosity as measured at 175° C. of from 2 to 10 Pa.s. Preferably, the melt viscosity thereof is from 3 to 8 Pa.s. Because the epoxy resin composition has a melt viscosity within that range, the semiconductor device can be easily separated from the adhesive sheet and an improvement in working efficiency is attained. The melt viscosity of an epoxy resin composition at 175° C. is measured, for example, in the following manner. The epoxy resin composition is molded into tablets, and the tablets are placed in the pot of a Koka flow tester. A given load is applied thereto for measurement. The melt of the epoxy resin composition which is kept at 175° C. is extruded through the orifice of a die to measure the piston travel speed in this extrusion. The melt viscosity (flow tester viscosity) of the epoxy resin composition is determined from the piston travel speed.

The epoxy resin composition for semiconductor encapsulation should be one which gives a cured resin having a flexural strength as measured at ordinary temperature of 130 MPa or higher. Preferably, the flexural strength of the cured resin is 140 MPa or higher. The upper limit of the flexural strength thereof generally is 200 MPa. The term "ordinary temperature" in this invention means a temperature in the range of 25±3° C. Because the cured resin formed from the epoxy resin composition has such a value of flexural strength, the semiconductor element 5 and the conductive parts 4 are wholly transferred to the encapsulating resin layer 8 when the adhesive sheet is stripped off in a semiconductor device production step described above. The flexural strength of the cured resin formed from the epoxy resin composition is measured in accordance with JIS K 7171 (Plastics; Flexural Property Testing Method). Examples of methods for the measurement include the method which will be described later.

The invention will be explained below in detail by reference to Examples.

Prior to Examples, the following ingredients were prepared.

Epoxy Resin a:

Biphenyl type epoxy resin represented by the following general formula (α) (epoxy equivalent, 192; melting point, 100° C.)

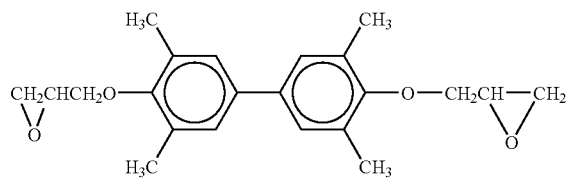

(a)

Epoxy Resin b:

Epoxy resin having repeating units represented by the following general formula (b) (epoxy equivalent, 170; melting point, 60° C.)

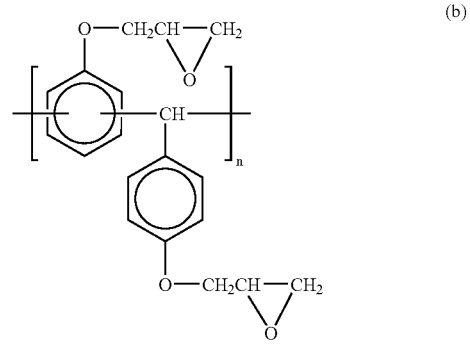

(b)

Epoxy-Resin c:

Epoxy resin represented by the following general formula (c) (epoxy equivalent, 198; melting point, 60° C.)

(c)

Phenolic Resin a:

Biphenyl novolac resin represented by the following general formula (d) (hydroxyl equivalent, 203; melting point, 90° C.)

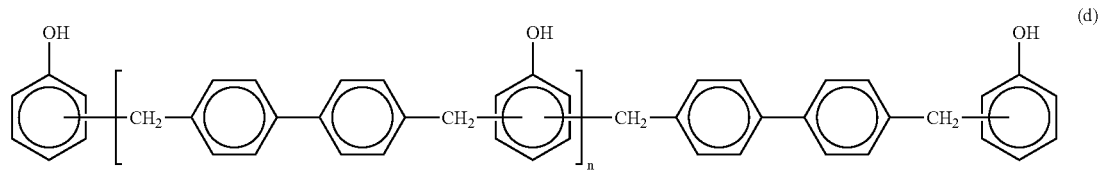

(d)

Phenolic Resin b:

Phenol-aralkyl resin represented by the following general formula (e) (hydroxyl equivalent, 170; melting point, 83° C.)

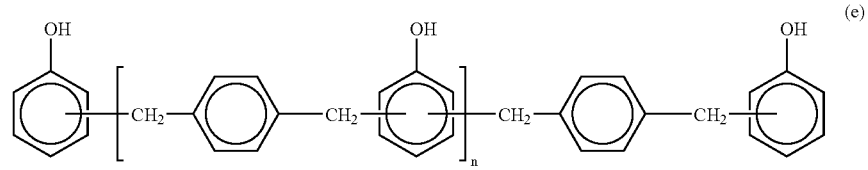

(e)

Phenolic Resin c:

Phenolic resin represented by the following general formula (f) (hydroxyl equivalent, 215; melting point, 81° C.)

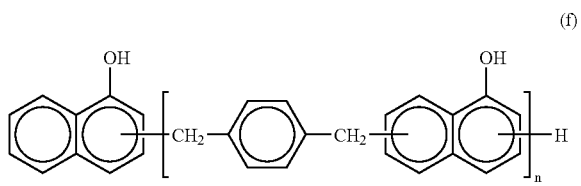

(f)

Hardening Accelerator:
Triphenylphosphine (TPP)

Release Agent:
Oxidized polyethylene wax

Inorganic Filler a:
Spherical fused silica powder having an average particle diameter of 30 μm Inorganic Filler b:
Spherical fused silica powder having an average particle diameter of 1 μm Carbon Black

EXAMPLE 1

Production of Adhesive Sheet:

In 350 parts of methyl ethyl ketone (MEK) were dissolved 20 parts of an acrylonitrile/butadiene rubber (Nipol 1072J; manufactured by Nippon Zeon Co., Ltd.; acrylonitrile content, 18% by weight), 50 parts of an epoxy resin (EPPN-501HY; manufactured by Nippon Kayaku Co., Ltd.), 30 parts of a phenolic resin (MEH-7500-3S, manufactured by Meiwa Plastic Industries, Ltd.), and 0.5 parts of a catalyst (TPP manufactured by Hokko Chemical Industry Co., Ltd.). Thus, an adhesive solution was prepared. Subsequently, the adhesive solution was applied to a copper alloy foil which had a thickness of 100 μm and had been surface-roughened on one side (BHY-13B-7025, manufactured by Japan Energy Corp.). The coating was dried at 150° C. for 3 minutes to thereby produce an adhesive sheet having a 15 μm-thick adhesive layer. The adhesive layer of this adhesive sheet, before cure, had a modulus as measured at 100° C. of $2.5 \times 10^{-3}$ Pa. After cure, the adhesive layer had a modulus as measured at 200° C. of 4.3 MPa. The adhesive force of the adhesive layer with respect to adhesion to the copper alloy foil was 12 N/20 mm. The adhesive layer of the adhesive sheet, after cure, had a glass transition temperature of 190° C. The copper alloy foil used as a base had a modulus as measured at 200° C. of 130 GPa. The glass transition temperature was measured with a viscoelastometer (DMA) manufactured by Rheometrics, Inc. under the conditions of a heating rate of 5° C./min. The moduli were measured at the respective temperatures under the following conditions.

Apparatus for evaluation: viscoelastic spectrometer (ARES) manufactured by Rheometrics, Inc.

Heating rate: 5° C./min
Frequency: 1 Hz
Measurement mode: tension mode

The adhesive force of the adhesive layer with respect to adhesion of the copper alloy foil was measured in the following manner. The adhesive sheet having a width of 20 mm and a length of 50 mm was laminated to a 35-μm copper foil (C7025, manufactured by Japan Energy Corp.) under the conditions of 120° C., 0.5 MPa, and 0.5 m/min. Subsequently, the laminate was allowed to stand in a 150° C. hot-air oven for 1 hour. Thereafter, the 35-μm copper foil was pulled away from the laminate in the 180° direction at a pulling speed of 300 mm/min in an atmosphere having a temperature of 23° C. and a humidity of 65% RH. The mean value of the pulling force was taken as the adhesive force.

Production of Epoxy Resin Composition:

The ingredients shown in Table 1 were mixed together according to the proportion shown therein. This mixture was treated with a roll kneader heated at 80-120° C. (for 5 minutes) and thus melt-kneaded to thereby produce an epoxy resin composition. The melt viscosity at 175° C. of the epoxy resin composition obtained was measured in the following manner, and the results thereof are shown in Table 1. Two grams of the epoxy resin composition obtained was precisely weighed out and molded into tablets. These tablets were placed in the pot of a Koka flow tester, and a load of 10 kg was applied thereto to make a measurement at 175° C. The molten epoxy resin composition was extruded through the orifice (1.0 mm (diameter)×10 mm) of a die and the piston travel speed during this extrusion was measured. The melt viscosity (flow tester viscosity) of the sample was determined from the piston travel speed. The results of this measurement are shown in Table 1.

Figure 9:
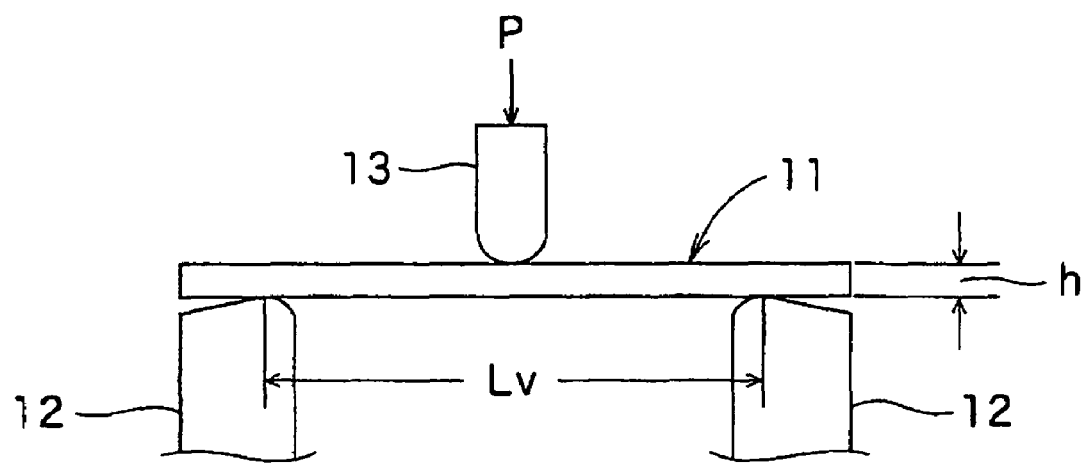
FIG. 9 is a view diagrammatically illustrating a method of measuring the flexural strength of a cured resin formed from an epoxy resin composition.

The flexural strength at ordinary temperature (25° C.) of the cured resin formed from the epoxy resin composition obtained above was measured in the following manner. The epoxy resin composition was hardened under the conditions of 175° C. and 120 seconds to produce a cured resin having a width, W, of 10 mm, length of 80 mm, and height, h, of 4 mm. As shown in FIG. 9, this cured resin (test piece) 11 was laid over the space between two metallic supports 12 each having a round top (support-to-support distance Lv=64 mm) and a metallic pressing wedge 13 having a round end was moved from over the center of the cured resin 11 at a pressing speed of 5 mm/min to apply loads to the cured resin 11 in the direction indicated by the arrow P. The load at the time when the cured resin 11 broke was measured (measuring conditions: 25° C. and 50% RH) and taken as the flexural strength. The results obtained are shown in Table 1.

Production of Semiconductor Device:

First, the adhesive sheet 3 produced above was prepared. As shown in FIG. 1, a substrate 9 (size: 4.2 mm×4.2 mm) for mounting a semiconductor element thereon and conductive parts 4 (size: 0.3 mm in diameter) were formed in given areas of the adhesive layer 2 side of the adhesive sheet 3.

The formation of a substrate 9 and conductive parts 4 was conducted in the following manner. A metal foil obtained by forming a pattern of these on copper by plating with nickel/palladium/gold was laminated at 120° C. to the adhesive layer 2 of the adhesive sheet 3, and those parts of this metal foil which corresponded to the conductive parts were partly embedded in the adhesive layer 2. Subsequently, those parts of the copper which did not correspond to the conductive parts were removed by the photographic pattern etching technique in general use to thereby form independent conductive parts 4. Thus, a structure which comprised the adhesive sheet 3, a substrate 9, and conductive parts 4 and in which the substrate 9 and the conductive parts 4 were in the state of being partly embedded in the adhesive layer 2 of the adhesive sheet 3 was produced.

Subsequently, as shown in FIG. 2, that face of a semiconductor element 5 which had no electrodes was bonded to the substrate 9 on the adhesive sheet 3 with an adhesive (EN-4000, manufactured by Hitachi Kasei Co., Ltd.). The semiconductor element 5 (size: 3.5 mm×3.5 mm) was thus mounted. Subsequently, the electrodes 6 of the semiconductor element 5 mounted on the substrate 9 were electrically connected to the conductive parts 6 with wires 7 as shown in FIG. 3 (wire bonding).

After the wire bonding, the semiconductor element 5 mounted on the substrate 9, the conductive parts 4 formed on the adhesive sheet 3, and the wires 7 were resin-encapsulated with the epoxy resin composition to form an encapsulating resin layer 8 (thickness, 0.45 mm). Thus, a semiconductor device was formed on the adhesive sheet 3. The resin encapsulation was conducted by transfer molding.

Conditions of Transfer Molding:
  Molding temperature: 175° C.
  Time: 120 seconds
  Clamp pressure: 200 kN
  Transfer speed: 3 mm/sec
  Transfer pressure: 5 kN Size of Semiconductor Device (Package):
  Each package has 156 conductive parts (diameter, 0.3 mm).
  Size of the whole package: 8.2 mm×8.2 mm
  Thickness of the package (encapsulating resin layer 8): 0.45 mm

EXAMPLES 2 TO 7 AND COMPARATIVE EXAMPLES 1 TO 5

Epoxy resin compositions were produced in the same manner as in Example 1, except that the materials for the epoxy resin composition in Example 1 and the amounts thereof were changed as shown in Tables 1 and 2. Using each epoxy resin composition, a semiconductor device was formed on an adhesive sheet 3 in the same manner as in Example 1. The melt viscosities (flow tester viscosities) of the epoxy resin compositions produced and the flexural strengths of the cured resins obtained from these epoxy resin compositions were measured in the same manners as described above. The results thereof are shown in Tables 1 and 2.

TABLE 1

| | | Example (parts) | | | | | | |
|---|---|---|---|---|---|---|---|---|
| | | 1 | 2 | 3 | 4 | 5 | 6 | 7 |
| Epoxy resin | a | 47 | — | 48 | 53 | 45 | 47 | 50 |
| | b | — | 45 | — | — | — | — | — |
| | c | — | — | — | — | — | — | — |
| Phenolic resin | a | — | 55 | 52 | — | 55 | 53 | 50 |
| | b | — | — | — | 47 | — | — | — |
| | c | 53 | — | — | — | — | — | — |
| Hardening accelerator | | 3 | 3 | 3 | 3 | 3 | 3 | 3 |
| Release agent | | 3 | 3 | 3 | 3 | 3 | 3 | 3 |
| Inorganic filler | a | 700 | 700 | 700 | 700 | 700 | 700 | 700 |
| | b | 100 | 100 | 100 | 100 | 100 | 100 | 100 |
| Carbon black | | 3 | 3 | 3 | 3 | 3 | 3 | 3 |
| Flow tester viscosity at 175° C. (Pa · s) | | 3 | 6 | 6.4 | 8 | 6 | 8 | 7 |
| Flexural strength at 25° C. (MPa) | | 140 | 150 | 145 | 160 | 130 | 151 | 170 |

TABLE 2

| | | Comparative Example (parts) | | | | |
|---|---|---|---|---|---|---|
| | | 1 | 2 | 3 | 4 | 5 |
| Epoxy resin | a | — | — | 50 | 25 | 33 |
| | b | 50 | — | — | — | — |
| | c | — | 65 | — | — | — |
| Phenolic resin | a | — | — | 50 | 75 | 67 |
| | b | 50 | 35 | — | — | — |
| | c | — | — | — | — | — |
| Hardening accelerator | | 3 | 3 | 3 | 3 | 3 |
| Release agent | | 3 | 3 | 3 | 3 | 3 |
| Inorganic filler | a | 700 | 700 | 350 | 700 | 700 |
| | b | 100 | 100 | 50 | 100 | 100 |
| Carbon black | | 3 | 3 | 3 | 3 | 3 |
| Flow tester viscosity at 175° C. (Pa · s) | | 14 | 16.7 | 1.5 | 4 | 9 |
| Flexural strength at 25° C. (MPa) | | 140 | 110 | 110 | 100 | 120 |

After each semiconductor device was formed on an adhesive sheet 3 in the manner described above, the adhesive sheet 3 was stripped off from the semiconductor device. Thus, semiconductor devices having the structure shown in FIG. 5 were produced. The semiconductor devices obtained each were a lead-less thin type device which had only the same thickness as the encapsulating resin layer 8 and in which part of the substrate 9 having the semiconductor element mounted thereon and part of the conductive parts 4 were exposed on the lower side thereof. In the stripping of the adhesive sheet 3, the adhesive sheet 3 was peeled by pulling it in the 90° direction at a pulling speed of 300 mm/min in an atmosphere having a temperature of 23° C. and a humidity of 65% RH. The mean value of the peel force was determined as the adhesive force. The results thereof are shown in Tables 3 and 4.

Furthermore, when the adhesive sheet 3 was stripped off after the encapsulating resin layer 8 was formed in a semiconductor device production step described above [in which 16 packages of the same size (4 packages×4 packages) disposed in matrix arrangement were en bloc molded] and allowed to cool to ordinary temperature, the percentage transfer of the conductive parts 4 was measured. Namely, the adhesive sheet 3 was stripped off by pulling it at a pulling speed of 300 mm/min under atmospheric conditions of 23° C. and 65% RH. In the case where all the conductive parts 4 had been transferred to the exposed epoxy resin composition (encapsulating resin layer 8), the percentage transfer was 100%. The number of conductive parts 4 remaining untransferred to the epoxy resin composition was counted and this number was divided by the total number of all conductive parts 4 (156×16=2,496) to determine the percentage transfer. The results obtained are shown in Tables 3 and 4.

TABLE 3

| | Example | | | | | | |
|---|---|---|---|---|---|---|---|
| | 1 | 2 | 3 | 4 | 5 | 6 | 7 |
| Peel force (N/50 mm) | 0.2 | 0.4 | 0.3 | 0.5 | 0.2 | 0.2 | 0.3 |
| Percentage transfer (%) | 97 | 90 | 85 | 98 | 100 | 100 | 100 |

TABLE 4

| | Comparative Example | | | | |
|---|---|---|---|---|---|
| | 1 | 2 | 3 | 4 | 5 |
| Peel force (N/50 mm) | 1.7 | 2.9 | 3.8 | 0.5 | 1.1 |
| Percentage transfer (%) | 95 | 60 | 50 | 30 | 99 |

The results given above show the following. In each of the Examples, in which epoxy resin compositions having a melt viscosity (flow tester viscosity) as measured at 175° C. of from 2 to 10 Pa.s and giving a cured resin having a flexural strength as measured at ordinary temperature of 130 MPa or higher were used, the peel force was as low as 0.5 N/50 mm or below and a high percentage transfer was obtained. The adhesive sheet could hence be easily stripped off to attain an excellent working efficiency. Highly reliable surface mount type semiconductor devices of a lead-less structure could be easily produced.

In contrast, in Comparative Examples 1 to 3, in which epoxy resin compositions having a 175° C. melt viscosity (flow tester viscosity) outside the range of from 2 to 10 Pa.s were used, the peel force was high and the stripping of the adhesive sheet in a production step was difficult. In Comparative Examples 4 and 5, in which the cured encapsulating resins obtained from the epoxy resin compositions had a flexural strength as measured at ordinary temperature of below 130 MPa, the percentage transfer in Comparative Example 4 was very low and the peel force in Comparative Example 5 was high, resulting in a poor working efficiency.

While the invention has been described in detail and with reference to specific embodiments thereof, it will be apparent to one skilled in the art that various changes and modifications can be made therein without departing from the scope thereof.

This-application is based on Japanese patent applications No. 2004-136137 filed Apr. 30, 2004 and No. 2004-229715 filed Aug. 5, 2004, the entire contents thereof being hereby incorporated by reference.

What is claimed is:

1. An epoxy resin composition for semiconductor encapsulation which is for use in producing a semiconductor device comprising an encapsulating resin layer and, encapsulated therein, a substrate, a semiconductor element mounted on the substrate, two or more conductive parts disposed around the semiconductor element, and electrically connecting parts which electrically connect electrodes of the semiconductor element to the conductive parts, wherein the bottom face of the substrate and the bottom face of each conductive part are exposed without being encapsulated in the encapsulating resin layer, and the epoxy resin composition used for forming the encapsulating resin layer has the following properties (α) and (β):

(α) the epoxy resin composition has a melt viscosity as measured at 175° C. of from 2 to 10 Pa.s; and (β) the epoxy resin composition gives a cured resin having a flexural strength as measured at ordinary temperature of 130 MPa or higher.

2. The epoxy resin composition for semiconductor encapsulation of claim 1, wherein the conductive parts each has overhangs at the both exposed bottom end and its facing end thereof.

3. A semiconductor device which comprises an encapsulating resin layer and, encapsulated therein, a substrate, a semiconductor element mounted on the substrate, two or more conductive parts disposed around the semiconductor element, and electrically connecting parts which electrically connect electrodes of the semiconductor element to the conductive parts, wherein the bottom face of the substrate and the bottom face of each conductive part are exposed without being encapsulated in the encapsulating resin layer, and the encapsulating resin layer comprises a cured resin formed from the epoxy resin composition for semiconductor encapsulation according to claim 1.

4. The semiconductor device of claim 3, wherein the conductive parts each have an overhang on each of the upper and lower sides thereof.

5. A process for producing the semiconductor device of claim 3, which comprises:

preparing an adhesive sheet comprising a base and an adhesive layer formed on a surface thereof; forming a substrate for mounting semiconductor element and two or more conductive parts are predetermined areas of the adhesive layer side of the adhesive sheet;

bonding the face of a semiconductor element which has no electrodes to the substrate to thereby mount the semiconductor element on the substrate; electrically connecting electrodes of the semiconductor element mounted on the substrate to the conductive parts; resin-encapsulating the substrate, the semiconductor element mounted on the substrate, the conductive parts formed on the adhesive sheet, and the electrically connecting parts for the conductive parts with an epoxy resin composition having the following properties (α) and (β) to thereby form a semiconductor device on the adhesive sheet; and stripping off the adhesive sheet from the semiconductor device formed:

(α) the epoxy resin composition has a melt viscosity as measured at 175° C. of from 2 to 10 Pa.s; and (β) the epoxy resin composition gives a cured resin having a flexural strength as measured at ordinary temperature of 130 MPa or higher.

6. The process for producing a semiconductor device of claim 5, wherein the conductive parts each have an overhang on each of the upper and lower sides thereof.

7. The process for producing a semiconductor device of claim 5, wherein the adhesive layer of the adhesive sheet is formed from a thermosetting adhesive composition.

8. The process for producing a semiconductor device of claim 5, wherein the adhesive layer of the adhesive sheet is formed from an epoxy resin composition having the following properties (x) and (y):

(x) the epoxy resin composition after cure has a glass transition temperature of 150° C. or higher; and (y) the epoxy resin composition after cure has a modulus as measured at 200° C. of 1 MPa or higher.

* * * * *